United States Patent [19]

Cox et al.

[11] 4,302,531

[45] Nov. 24, 1981

[54] METHOD OF MANUFACTURE OF PHOTODIODE

[75] Inventors: John T. Cox, Alexandria, Va.; Michael B. Garber, Columbia, S.C.; Marilyn A. Jasper, Springfield; Randolph E. Longshore, Alexandria, both of Va.

[73] Assignee: The United States of America as represented by the Secretary of the Army, Washington, D.C.

[21] Appl. No.: 30,506

[22] Filed: Apr. 16, 1979

Related U.S. Application Data

[62] Division of Ser. No. 893,847, Apr. 6, 1978, Pat. No. 4,170,781.

[51] Int. Cl.³ .................. H01L 27/14; H01L 31/18
[52] U.S. Cl. ................................ 430/317; 29/572; 148/188; 357/30; 427/74
[58] Field of Search .............. 427/74; 29/572; 357/30; 148/188; 430/317

[56] References Cited

U.S. PATENT DOCUMENTS 3,961,998 6/1976 Scharnhorst .................. 29/572

OTHER PUBLICATIONS

Lovecchio et al., Planar $Pb_{0.8}Sn_{0.2}Te$ Photodiode Array Development at the Night Vision Laboratory, *Infrared Physics*, vol. 15, pp. 295-301 (1975).
Bradford et al. Preparation of Vapor Grown Lead-Tin Telluride for 8-14 Micrometer Photodiodes, *Infrared Physics*, vol. 15, pp. 303-309 (1975).

*Primary Examiner*—James R. Hoffman
*Attorney, Agent, or Firm*—Nathan Edelberg; Milton W. Lee; John E. Halford

[57] ABSTRACT

A process is described in which planar photodiodes are formed by diffusing lead into p-type $Pb_{0.8}Sn_{0.2}Te$ single crystal material.

7 Claims, 12 Drawing Figures

|  | 300°K | 77°K |
|---|---|---|
| RESISTIVITY (OHM-cm) | $4.2 \times 10^{-2}$ | $1.3 \times 10^{-3}$ |
| HALL COEFFICIENT (cm$^3$/COUL) | 14 | 34 |
| MOBILITY (cm$^2$/VOLT-SEC) | $3.4 \times 10^2$ | $2.7 \times 10^4$ |
| CARRIER CONCENTRATION (cm$^{-3}$) | $4.4 \times 10^{17}$ | $1.8 \times 10^{17}$ |
| TYPE | p | p |
FIG. 3
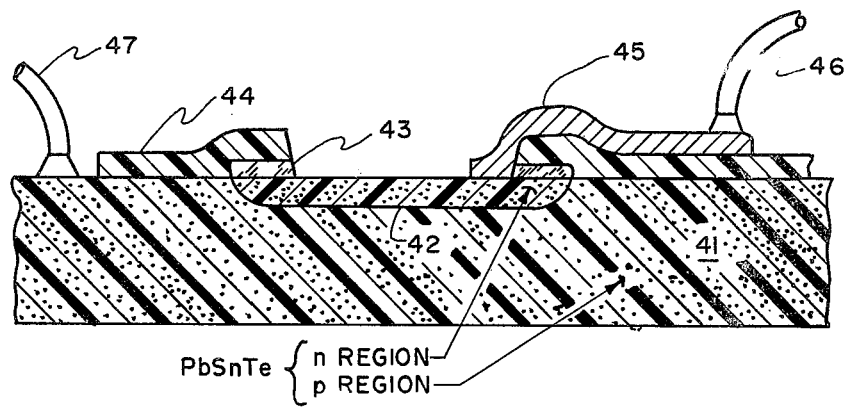
FIG. 4
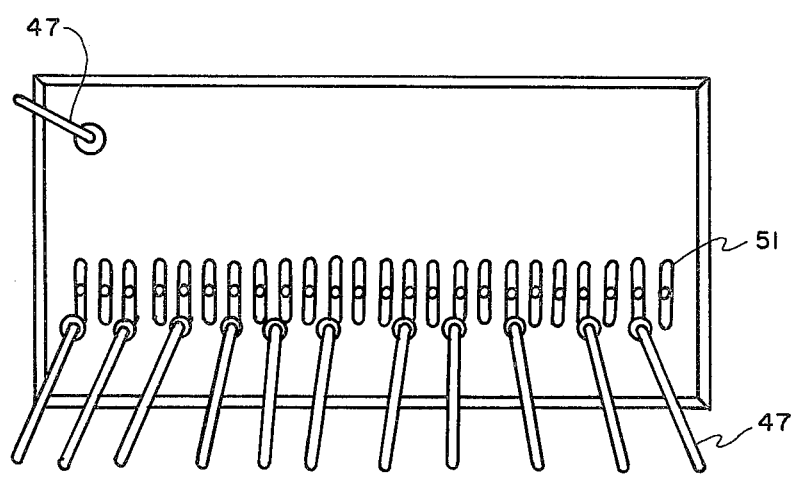
FIG. 5

METHOD OF MANUFACTURE OF PHOTODIODE

The invention described herein may be manufactured, used, and licensed by the U.S. Government for governmental purposes without the payment of any royalties thereon.

This is a division of application Ser. No. 893,847, filed Apr. 6, 1978, now U.S. Pat. No. 4,170,781, issued Apr. 6, 1979.

BACKGROUND OF THE INVENTION

Detector fabrication techniques are currently being examined in order to develop PbSnTe photodiodes which are stable, have high quantum efficiencies and which have resistance-area products large enough for efficient signal injection into CCDs. Devices with these characteristics are required for the future development of focal planes, operating in the 8–14 micrometer range, containing at least 1000 detectors interfaced with silicon signal processors. Prior results have been reported for PbSnTe infrared detectors fabricated by using indium as the dopant to form shallow n-p junctions. See "Planar $Pb_{0.8}Sn_{0.2}Te$ Photodiode Array Development at the Night Vision Laboratory," by P. LoVecchio, et al, Infrared Physics, Vol. 15, Nov 75, pp 295–301. Detectivities of $2\times10^{10}$ cm$\sqrt{Hz}$/w ("w" being watts) and RA products of 0.4 ohm. cm$^2$ were obtained using indium, where R is the zero-bias impedance of the diode and A is the sensitive area. These RA product values are much too low for efficient signal injection into CCDs. In addition, the 100° C. vacuum bake temperature required for good vacuum integrity is approximately equal to the diffusion temperature of indium, and there were some indications that the indium devices tended to be unstable when exposed to temperatures of the order of 100° C.

BRIEF DESCRIPTION OF THE INVENTION

An object of the present invention is therefore to provide a PbSnTe diode and method of fabrication using a viable alternative to indium such as lead which can be diffused at a temperature of 400° C., thus forming devices which are more stable at vacuum bake-out temperatures. In addition, since the diffusion coefficient of lead into PbSnTe is smaller than the diffusion coefficient of indium, the junction profile is easier to control and allows the formation of a sharp junction, resulting in an increase in the zero-bias resistance and hence an increase in the RA product.

BRIEF DESCRIPTION OF THE DRAWINGS

The invention is best described in conjunction with the attached drawings wherein:

FIG. 3 shows a chart of the electrical properties of a PbSnTe substrate prior to diode manufacture;

FIG. 4 shows a cross-sectioned view of a single completed diode;

FIG. 5 shows a small test array of eleven diodes;

DESCRIPTION OF THE PREFERRED EMBODIMENT

Figure 1:
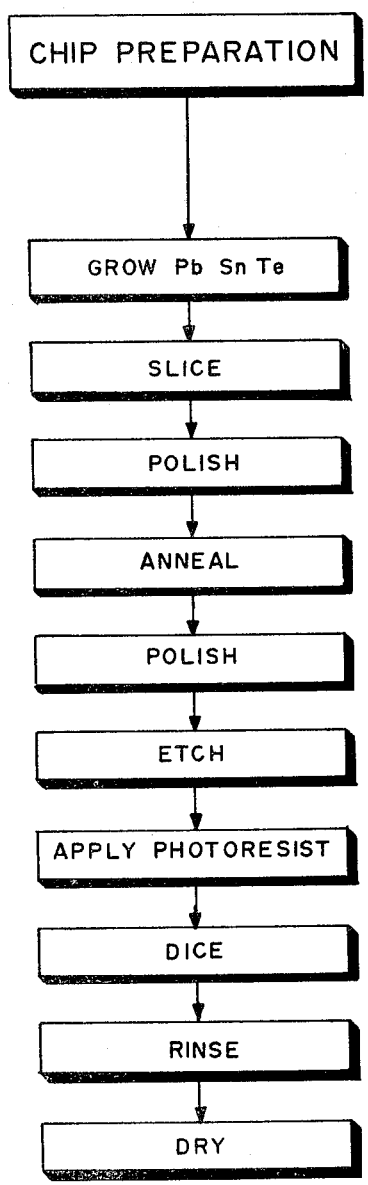
FIG. 1 shows a flow chart of the preferred PsSnTe chip preparation prior to the formation of diode devices thereon.

Referring specifically to FIG. 1 there is shown a flow chart of the preferred method of preparing a PbSnTe substrate or chip which involves the following steps:

1. First the bulk PbSnTe single crystals used in the fabrication of the photodiodes must be grown, for example, as described in detail in prior art, see "Preparation of Vapor Grown Lead-Tin-Telluride for 8-14 Micrometer Photodiodes," by A. Bradford and E. Wentworth, Infrared Physics, Vol. 15, Nov 75, pp 303–309, single crystals of PbSnTe are best grown by the closed-tube vapor transport technique using a seed crystal oriented in the [111] direction, typical as-grown material is p-type, with carrier concentration in the mid $10^{19}$/cm$^3$ region and with mobilities of the order of $10^3$cm$^2$/V-sec at 77° K.;
2. These crystals are next sliced into wafers 70 mils thick;
3. The crystals are then polished and etched to remove saw damage;
4. The wafers are next annealed in a metal rich atmosphere for 30 days at 550° C.;
5. After annealing, the wafers are polish-etched on a Pellon pad;
6. The wafer is then free etched in 8% Br+HBr for 5 minutes to remove a thin n-type layer which forms during the cooldown from the annealing temperature, producing wafers approximately 36 mils thick, the electrical properties of which are shown in FIG. 3;
7. Wafers with the above characteristics are next coated with Shipley Protoresist;
8. The wafers are then diced into chips 0.7 cm×0.3 cm;
9. The resulting chips are rinsed with the following sequence of solvents: acetone, trichlorethylene, acetone, deionized water, and methanol; and finally
10. The chips are subsequently blown dry with nitrogen gas, thereby providing suitable surface conditions to fabricate detectors.

FIG. 3 shows a table of the electrical characteristics of the chips at this stage.

Figure 2:
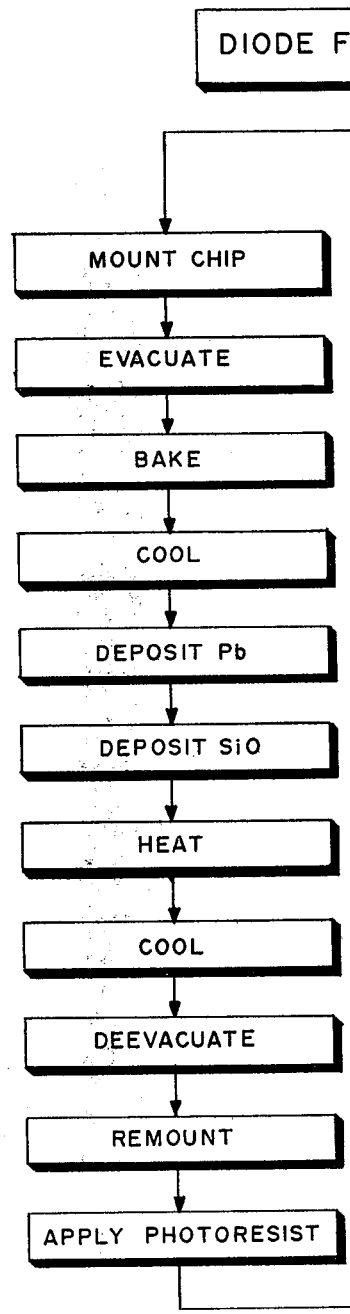
FIG. 2 shows a flow chart of steps preferred in the formation of the diode detector array on the prepared chip.
Figure 2:
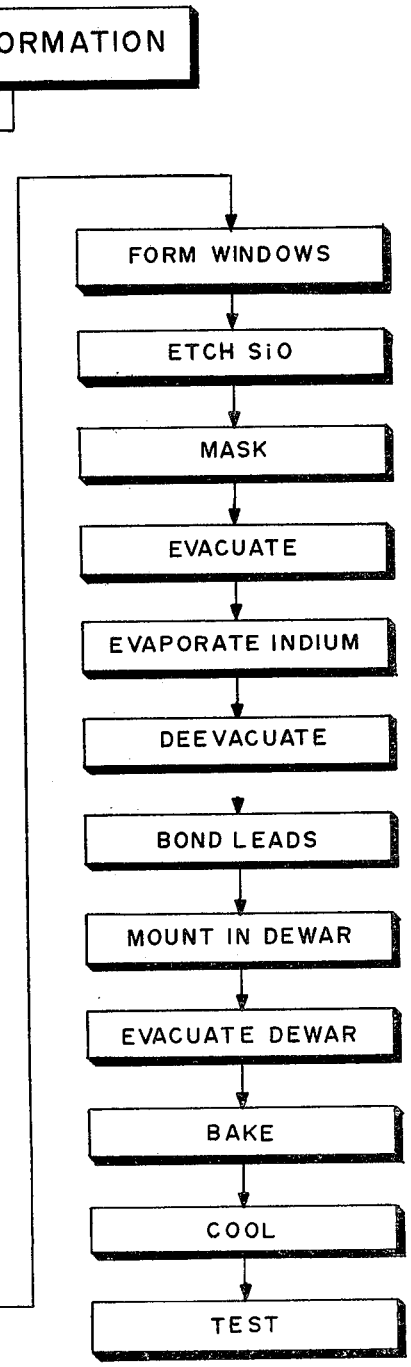

FIG. 2 shows the fabrication technique that is used to form the planar detectors which includes the following steps:

1. The chip is first mounted on a metal holder behind a metal mask defining the desired sensitive areas for the detector array and placed into a vacuum chamber;
2. The chamber is then evacuated to a pressure of $10^{-6}$ torr;

3. The mounted chip is next baked under vacuum at 150° C. for 30 minutes prior to the lead-deposition in order to remove residual water vapor and other absorbed gasses;
4. The sample is then allowed to cool to 35° C.;
5. A film of lead approximately 50 Å thick is next deposited through the metal mask onto the PbSnTe surface using a tungsten boat as the thermal evaporation source, at deposition rates of 5 to 10 angstroms per second;
6. A silicon monoxide layer 500 angstroms thick is then deposited over the lead through the same mask from a molybdenum boat evaporation source at a deposition rate of about 20 angstroms per second to inhibit the evaporation of the lead during the subsequent diffusion process;
7. The coated chip is next heated to 400° C. for 20 minutes in order to diffuse the lead into the PbSnTe crystal;
8. The heated chip, at this point, may be allowed to cool to near room temperature which normally takes about 60 minutes.
9. The cooled or still warm chip is then removed from the vacuum system and the metal mask removed;
10. The chip is next permanently remounted on an aluminum substrate with a suitable mounting means, such as Stycast 2057 epoxy;
11. The chip is next coated with any suitable negative photoresist which serves both as a photolith mask and as a insulating layer for electrical contacts;
12. Windows are then photographically opened in the photoresist to define frames contact regions;
13. SiO is next etched out of the smaller framed contact regions using a buffered HF solution leaving a layer of SiO remaining as a frame around the outer borders of the contact regions;
14. The coated chip is next fitted with a new mask;
15. The chip is then placed back into the vacuum system;
16. A 0.7 um thick layer of indium or other conducting metal is next evaporated through the metal mask to make lead out electrical contacts from the sensitive smaller framed window areas onto the insulating photoresist material;
17. The final detector array at this point is removed from the vacuum system;
18. A separate gold wire is next bonded with silver epoxy to each indium contact and an undoped area on the substrate;
19. The array is then mounted to the cold finger of a glass walled test dewar having electrodes sealed through the wall contacting;
20. The dewar is then evacuated;
21. The chip is next given a post bake of 15 hours at 100° C.;
22. The chip is then cooled to a suitable temperature for testing; and
23. The external ends of the dewar electrodes are plugged into a test monitor to evaluate the chip.

FIG. 4 shows the final structure of this type of planar PbSnTe detector. The p-type substrate 41 has numerous n-type contact regions of islands 42 with borders 43 of SiO covered with photoresist 44 and indium lead outs 45. Each lead out is connected to a lead 46 and a common lead 47 must be provided for the substrate.

FIG. 5 shows a finished array with eleven diode elements 51 wired for testing. Each of the steps in FIG. 2 were found to be essential in order to fabricate detector with high RA products. For example, use of the SiO frame around the junction resulted in a significant enhancement of the RA product. Detectors fabricated without the SiO frame, had low RA products in the range of 0.3 to 0.5 Ωcm². It is felt that the SiO frame reduces surface charge leakage around the outer edge of the junction.

Figure 6A:
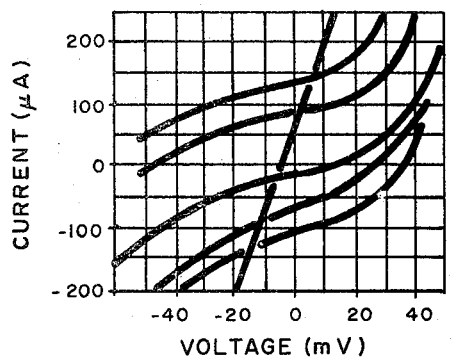
FIGS. 6a and 6b show, respectively, current vs voltage plots of the diodes before and after the post-bake step (twenty-first step) in FIG. 2.
Figure 6B:
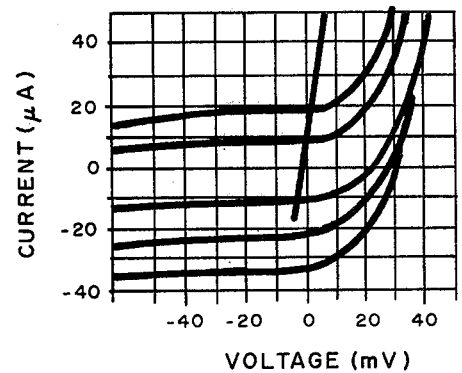

The post-bake treatment (twenty-first step) in FIG. 2, was also found to have a significant affect on the detector performance. Data before and after the post-bake are shown in FIGS. 6a and 6b. The I-V curves in FIG. 6a are for an array just before the post-bake treatment. Typical RA products of 0.3 Ωcm² were measured for these devices. After baking, RA products increased to 4.0 Ωcm² as is evident from the I-V curves shown in FIG. 6b. It has been found that these detectors degrade after being exposed to the atmosphere and must be given the bake treatment in the evacuated dewar to regain their initial characteristics. Evidently, moisture is collected at the detector surface which acts as a current leakage path and must be given off by baking.

Figure 7:
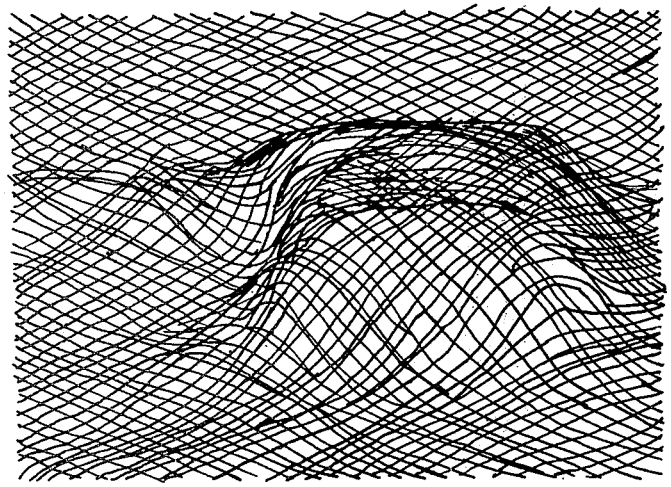
FIG. 7 shows a sketch of a response plot of the detector area produced by laser scanning.

Data from an array fabricated using all the steps in FIG. 2 are shown in FIGS. 7 through 12. Uniformity of responsivity over the area of a typical detector element in the array (flat contour) is shown in FIG. 7. This information was produced by scanning a laser beam ($\approx$0.2 mils dia.) over the array and sensing the detector output signal with an oscilloscope. Note that the responsivity is very uniform over the area and that there is some slight sensitivity around the contact region. From this figure, the sensitive area for the detector element was determined to be $4.1 \times 10^{-4}$ cm².

Figure 8:
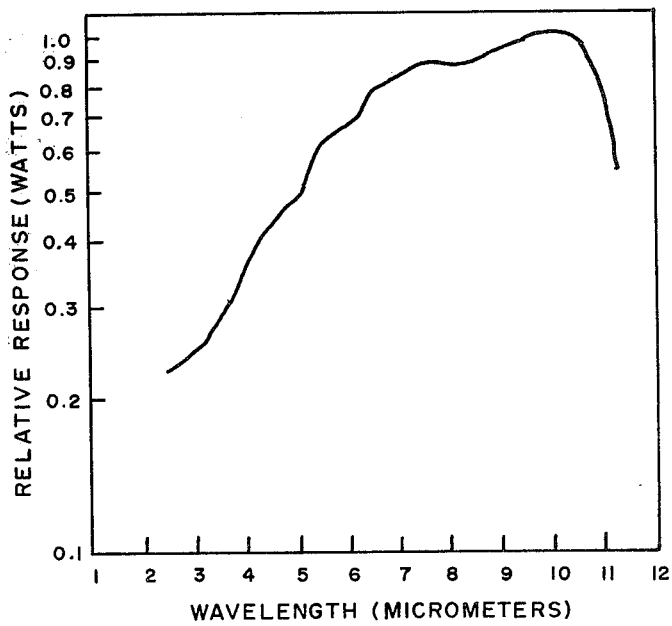
FIG. 8 shows a plot of the average response of the diode of FIG. 4 as a function of wavelength.

FIG. 8 is a plot of the relative spectral responsivity for the array. The peak responsivity occurs at a wavelength of 10.5 micrometers and the cutoff wavelength is at 11.5 micrometers. The ripples in the curve may be due to the photoresist layer around the edge of the junction.

Figure 9:
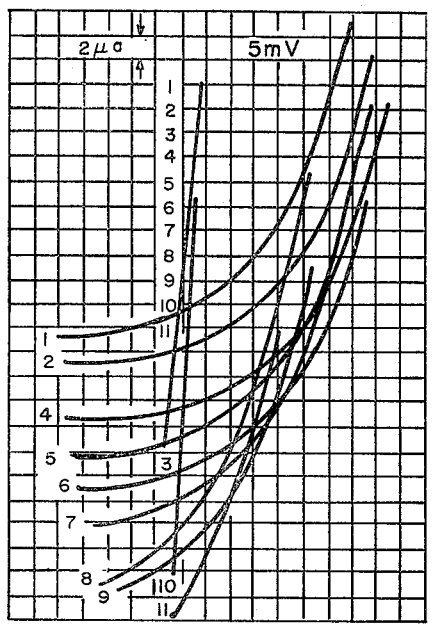
FIG. 9 shows the current vs voltage characteristics of each of eleven diodes shown in FIG. 5.

FIG. 9 shows the I-V curves for this array. Six of the elements are very uniform, with four devices having zero-bias impedance values greater than 10 kΩ. The short circuit current is 20 uA for most of the detectors looking at a 300° K. background with a 106° FOV. The offset zero points for the numbered curves are indicated on the vertical axis.

Figure 10:
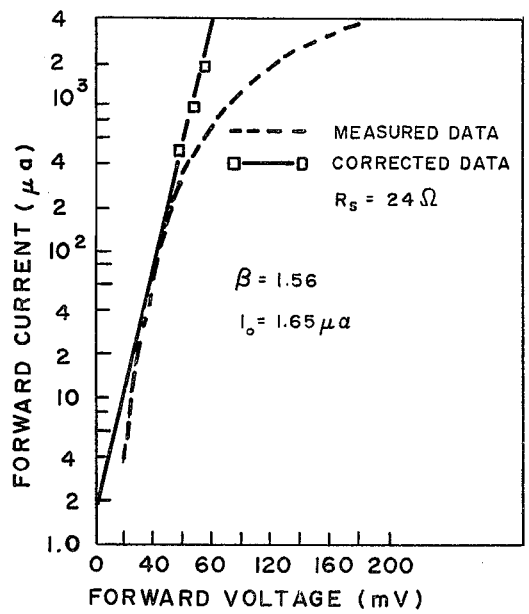
FIG. 10 shows the forward current vs voltage characteristics of a typical detector from FIG. 5 under a 77° K. background condition.

FIG. 10 is a plot of the forward characteristics of a typical detector in the array under a 77° K. background condition. The forward current is plotted on a log scale versus the forward voltage. The measured data were corrected to account for a series resistance of 24 Ω and the voltage drop across this resistance was subtracted from the total forward voltage to give the voltage drop across the diode. The series resistance was determined by I-V measurements at room temperature, and it is attributed to the epoxy bonds to the indium contact pads. The corrected data should fall on a straight line if the detector follows the general diode equitation, $$I_f = I_o[\exp(V_f/\beta kT) - 1]$$

(for cases where the exponential term is much greater than one). The $\beta$ value indicates the type of mechanism responsible for the current flow. For the case in which diffusion of carriers to the junction dominates, $\beta = 1$. For currents due to the recombination of carriers in the junction depletion region, $\beta = 2$. In FIG. 10, a $\beta$ value of 1.56 was found indicating that there are contributions from both the diffusion and the recombination mechanisms.

Figure 11:
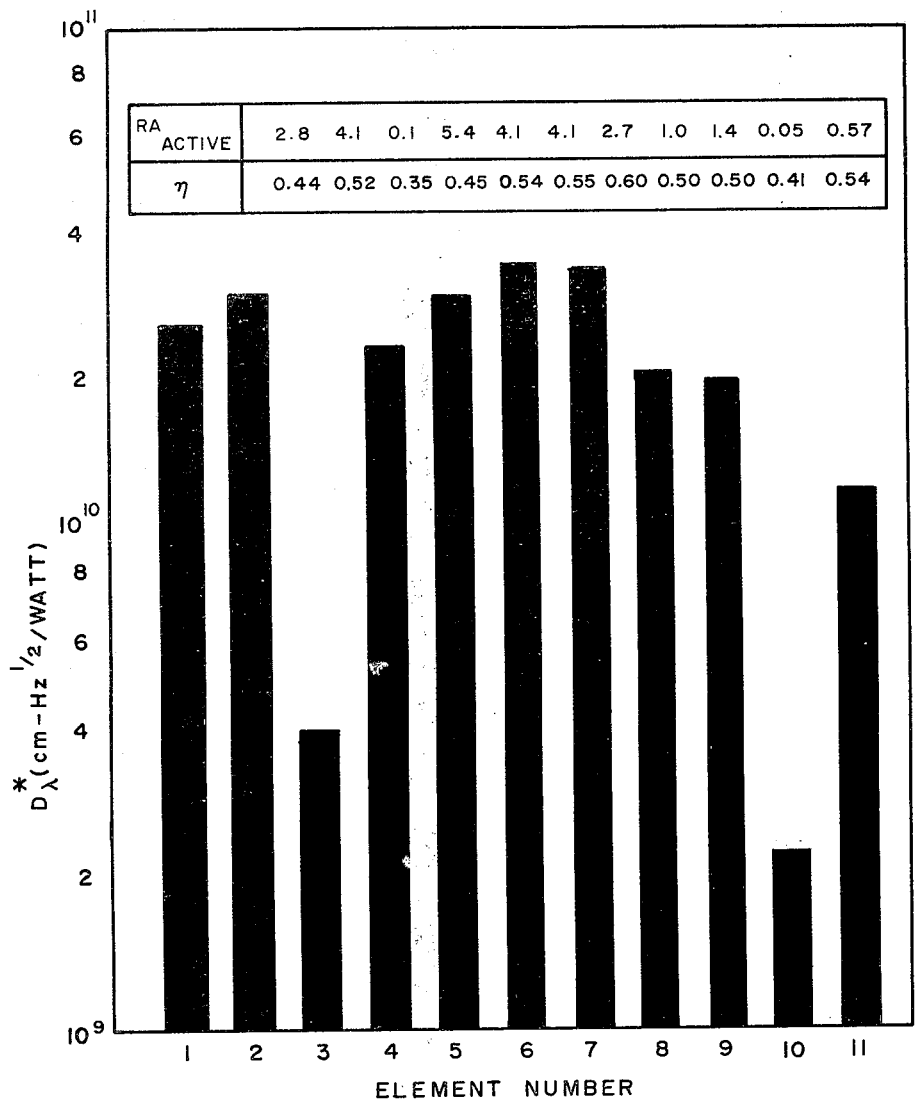
FIG. 11 shows the detectivity, RA product and quantrum efficiency for each detector in FIG. 5.

FIG. 11 gives the $D^*_{\lambda p}$ values, RA products and quantum efficiencies for each detector element in the array. The element numbers correspond to those in FIG. 9. Note that for six of the devices, RA's are greater than 2 $\Omega cm^2$. The area used to calculate these RA products is the actual sensitive area of the detector, whereas the total junction area is 30% larger. The quantum efficiency values were determined from the detector signal voltage produced by a 500° K. black body. Some quantum efficiency values are larger than the expected reflection-limited value of 50%. The detectors were not anti-reflection coated and it has not been determined why these values are larger than 50%. $D^*_{\lambda p}$ values across the array are fairly uniform with a maximum value of $D^*_{\lambda p} = 3.4 \times 10^{10}$ cm$\sqrt{Hz}$/w. All $D^*_{\lambda p}$ values were measured in a dewar with a 106° FOV at 77° K. The Background Limited Infrared Photodetector (BLIP) $D^*_{\lambda p}$ value for a 106° FOV at 10 micrometers is approximately $6.3 \times 10^{10}$ cm$\sqrt{Hz}$/w, indicating that these detectors are within approximately 50% of BLIP.

Figure 12:
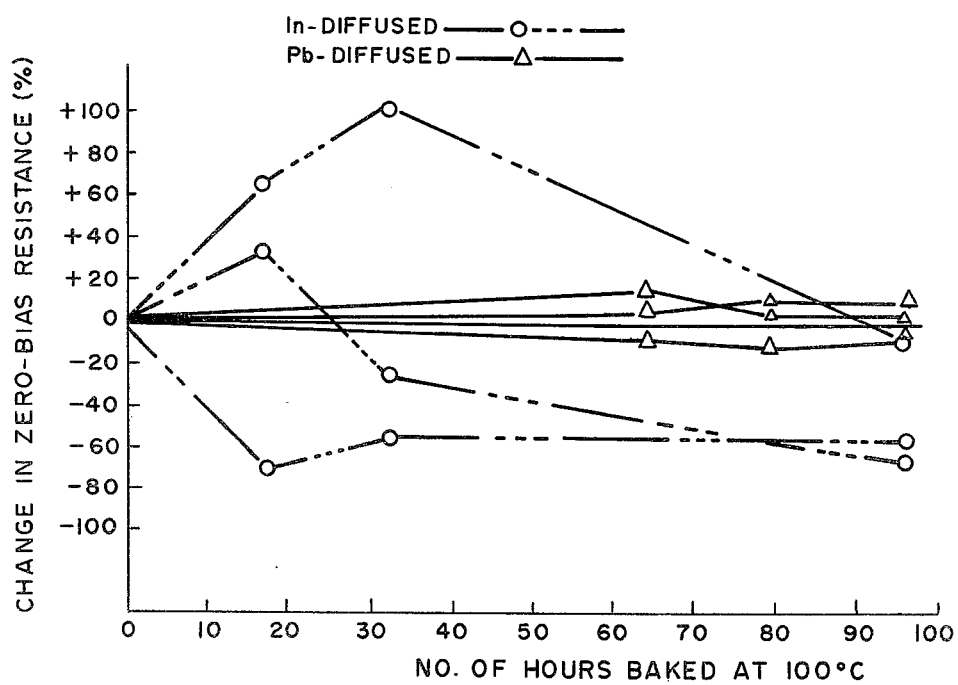
FIG. 12 shows the change in zero-bias resistance as a function of the number of hours baked in step 21 of FIG. 2.

Preliminary thermal stability data for these devices are indicated in FIG. 12 in comparison with thermal stability data for devices fabricated using indium as the n-type dopant. FIG. 12 is a plot of of percentage change in the zero-bias impedance of the detector as a function of the number of hours of bake at 100° C. This figure clearly shows that the variation in RA product of the lead devices is much less severe than with the indium devices.

Many variations of the above described methods and resulting products will be immediately apparent to those skilled in the art, but the invention is to be limited only by the claims which follow.

We claim:

1. The method of forming one or more photodiodes comprising the steps of:
    placing a clean chip of lead-tin-telluride in a vacuum chamber;
    reducing the pressure in said chamber to approximately $10^{-6}$ torr;
    prebaking the chip;
    depositing a thin layer of lead on at least one selected portion of said chip;
    depositing a nonconducting evaporation inhibiting layer of SiO over said lead layer which is compatible with processing temperatures of at least 400° C.;
    diffusing said layer of lead into said chip at a temperature of approximately 400° C. for approximately 20 minutes;
    removing said chip from said vacuum chamber;
    coating said chip with a dielectric layer of insulating material;
    removing only that part of said non-conducting layer of SiO and said dielectric layer of insulating material which cover a surface area within each said selected portion to expose a portion of said surface area;
    returning said chip to said chamber;
    reducing the chamber pressure again to $10^{-6}$ torr; and
    depositing a lead-out structure of individual indium contacts over and through said nonconducting layer with a separate contact connected to said exposed area of each selected portion of said chip.

2. The method according to claim 1 wherein: said prebaking step is performed at 150° C. for 30 minutes.

3. The method according to claim 1 or 2 wherein: said depositing of lead is performed with an electrically heated tungsten boat at a rate of 5-10 A per second to layer thickness of about 50 A.

4. The method according to claim 1 wherein said step of depositing a non-conducting layer comprises:
    depositing a layer of silicon monoxide at a rate of about 20 angstroms per second until a thickness of 500 angstroms is obtained.

5. The method according to claim 1, wherein said steps of coating said chip with a dielectric layer and removing a part of said non-conducting layer comprises the steps of:
    coating said chip with photoresist;
    photographically removing said photoresist covering said part of said non-conducting layer; and
    etching away said part with hydrofluoric acid.

6. The method according to claim 1 further including the steps of:
    mounting a first metal mask on said chip prior to said step of placing said chip in said vacuum chamber, said mask having an aperture defining said selected portion; and
    removing said mask after removing said chip from said chamber and before any subsequent processing steps.

7. The method according to claim 6 further including the step of:
    mounting a second metal mask on said chip after removing said first mask and before returning said chip to said chamber, said mask having an aperture defining said lead out structure.

* * * * *